(12) United States Patent
Mehrotra et al.

(10) Patent No.: US 6,737,325 B1
(45) Date of Patent: May 18, 2004

(54) METHOD AND SYSTEM FOR FORMING A TRANSISTOR HAVING SOURCE AND DRAIN EXTENSIONS

(75) Inventors: Manoj Mehrotra, Plano, TX (US); Reima Tapani Laaksonen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/383,322

(22) Filed: Mar. 6, 2003

(51) Int. Cl.[7] ............... H01L 21/366; H01L 21/3205; H01L 21/4763
(52) U.S. Cl. ............... 438/305; 438/262; 438/585
(58) Field of Search ............... 438/305, 262, 438/753, 585, 595

(56) References Cited

U.S. PATENT DOCUMENTS

| 6,013,570 | A | * | 1/2000 | Yu et al. ............... 438/595 |
| 6,283,131 | B1 | * | 9/2001 | Chen et al. ............... 134/1.2 |
| 6,368,982 | B1 | * | 4/2002 | Yu ............... 438/753 |
| 6,420,097 | B1 | * | 7/2002 | Pike et al. ............... 430/313 |
| 6,482,726 | B1 | * | 11/2002 | Aminpur et al. ............... 438/585 |
| 6,566,214 | B1 | * | 5/2003 | Lyons et al. ............... 438/305 |
| 6,586,303 | B2 | * | 7/2003 | Wu ............... 438/262 |
| 6,586,755 | B1 | * | 7/2003 | Krivokapic et al. ... 250/492.21 |
| 6,596,599 | B1 | * | 7/2003 | Guo ............... 438/305 |

* cited by examiner

Primary Examiner—John F. Niebling
Assistant Examiner—Walter L. Lindsay, Jr.
(74) Attorney, Agent, or Firm—Yingsheng Tung; Wade James Brady, III; Frederick J. Telecky, Jr.

(57) ABSTRACT

According to one embodiment of the invention, a method for manufacturing a transistor is provided. The method includes masking a polysilicon layer of a semiconductor device to have a dimension greater than a critical dimension of a gate to be formed. The polysilicon layer overlies a substrate layer. The method also includes incompletely etching the polysilicon layer. The method also includes forming a source region and a drain region in the substrate layer through the incompletely etched polysilicon layer by doping the substrate layer and applying heat at a first temperature. The method also includes forming a source extension and a drain extension in the substrate layer after forming the source region and the drain region by doping the substrate layer and applying heat at a second temperature.

21 Claims, 3 Drawing Sheets

METHOD AND SYSTEM FOR FORMING A TRANSISTOR HAVING SOURCE AND DRAIN EXTENSIONS

TECHNICAL FIELD OF THE INVENTION

This invention relates generally to semiconductor manufacturing and more particularly to a method and system for forming a transistor having source and drain extensions.

BACKGROUND OF THE INVENTION

Transistors are prevalent in today's society. Many challenges exist in creating smaller and faster transistors. One example of a transistor utilizes a source and drain together with source and drain extensions extending under the channel region of the transistor. The source and drain regions as well as the extensions are often formed through an implant and an anneal process. Annealing drives the implanted dopants both downward and laterally, forming the source and drain regions as well as the extensions. Problems occur in accurately defining the source and drain regions and their extensions due to incomplete control of the annealing process.

SUMMARY OF THE INVENTION

According to one embodiment of the invention, a method for manufacturing a transistor is provided. The method includes masking a polysilicon layer of a semiconductor device to have a dimension greater than a critical dimension of a gate to be formed. The polysilicon layer overlies a substrate layer. The method also includes incompletely etching the polysilicon layer. The method also includes forming a source region and a drain region in the substrate layer through the incompletely etched polysilicon layer by doping the substrate layer and applying heat at a first temperature. The method also includes forming a source extension and a drain extension in the substrate layer after forming the source region and the drain region by doping the substrate layer and applying heat at a second temperature.

Some embodiments of the invention provide numerous technical advantages. Some embodiments may benefit from some, none, or all of these advantages. For example, according to one embodiment, a shallow junction may be formed for a semiconductor device. In another embodiment, source and drain over-extension may be avoided. In another embodiment, the thermal budget for manufacturing a transistor having source and drain extensions may be reduced.

Other technical advantages may be readily ascertained by one of skill in the art.

BRIEF DESCRIPTION OF THE DRAWINGS

Reference is now made to the following description taken in conjunction with the accompanying drawings, wherein like reference numbers represent like parts, in which.

DETAILED DESCRIPTION OF EXAMPLE EMBODIMENTS OF THE INVENTION

Embodiments of the invention are best understood by referring to FIGS. 1A through 2C of the drawings, like numerals being used for like and corresponding parts of the various drawings.

Figure 1A:
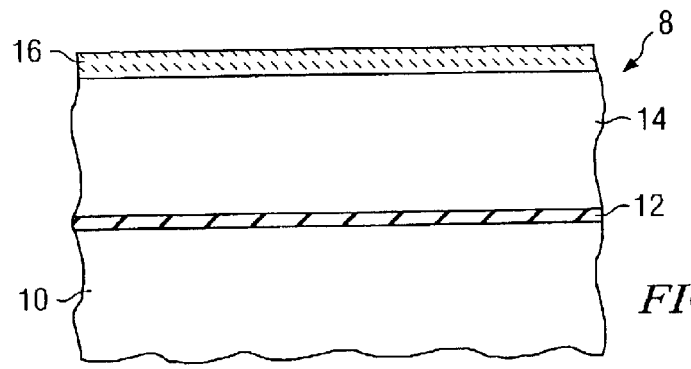
FIGS. 1A through 1G are partial cross-sectional drawings showing the construction of a transistor according to the teachings of the invention.

FIG. 1A illustrates one embodiment of a semiconductor device 8 that may benefit from the teachings of the present invention. Semiconductor device 8 is a starting point for forming a transistor according to the teachings of the present invention. Semiconductor device 8 comprises a silicon substrate layer 10 in which the active regions of a transistor will be formed, a gate dielectric layer 12, a polysilicon layer 14, and a hardmask layer 16. Gate dielectric layer 12 overlies substrate layer 10. Gate dielectric layer 12 may be formed from any suitable insulation material, examples of which include oxide and nitride. Polisilicon layer 14 overlies gate dielectric layer 12. Polysilicon layer 14 may be formed from any suitable type of polysilicon. Hardmask 16 overlies polysilicon layer 14. Hardmask 16 may be formed from any suitable masking material, examples of which include nitride and oxide.

The structure of FIG. 1A is patterned with any suitable resist (not explicitly shown) and portions of hardmask 16 are etched with a suitable etch procedure. For example, a dry etch procedure according to conventional, or yet to be developed, techniques may be used to form the structure of FIG. 1B.

Figure 1B:
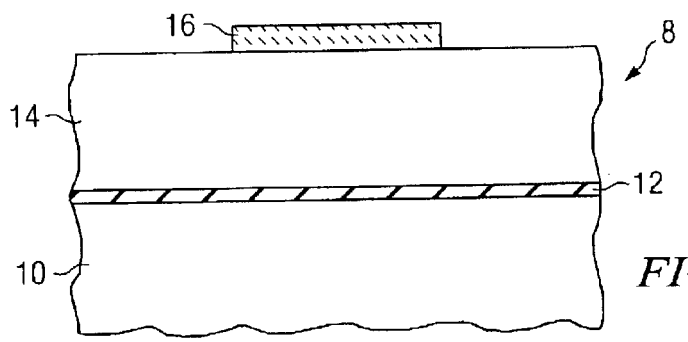

FIG. 1B illustrates semiconductor device 8 of FIG. 1A after the removal of portions of hardmask 16 through the described etch. As shown in FIG. 1B, the pattern of hardmask 16 defines a feature that may be used to form a gate. In one embodiment, the size of the defined feature is greater than the critical dimension of the gate to be formed. Using hardmask 16, an incomplete etch of polysilicon layer 14 is performed to result in the structure of FIG. 1C. Any suitable etch process may be used. For example, a dry etch may be used.

Figure 1C:
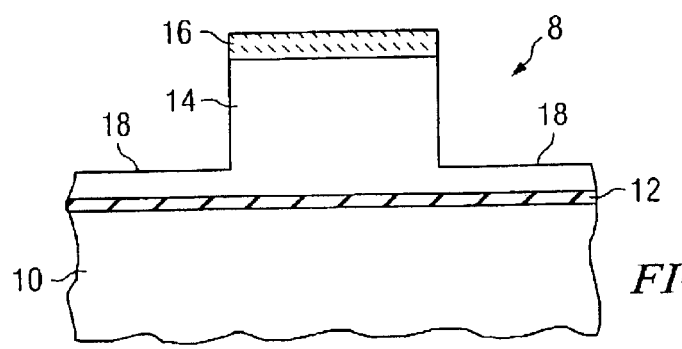

As illustrated in FIG. 1C, the etch of polysilicon layer 14 is incomplete. An incomplete etching refers to etching a layer to result in a screen that overlies another target layer. For example, as shown in FIG. 1C, portions 18 of polysilicon layer 14 remain at a reduce thickness after the etch and overlie gate dielectric 12. Such an incomplete etch may be performed to protect the underlying layers 12 and 10 and/or control the size of a source region 20 and a drain region 22, which is described below in conjunction with FIGS. 1D and 1E. In one embodiment, the thickness of the incompletely etched portions 18 may be approximately 50–150 angstroms.

Techniques for performing such an incomplete etch are well known. Examples of such techniques include interferometry, a timed etch, and an etch rate monitoring etch. In an interferometry etch, optical measurements are performed to determine how far an etch has gone, thus enabling a particular layer of polysilicon to be incompletely etched. In a timed etch, the rate of etching is known and thus a selective portion of polysilicon 14 may be etched at the known rate of etching for a time period that will result in a desired thickness of the polysilicon. With an etch rate monitoring etch, an extra layer of polysilicon underlying the etched layer of polysilicon is provided. The etching stops when that extra layer of polysilicon is reached. This approach is described in greater detail in conjunction with FIGS. 2A through 2C.

Figure 1D:
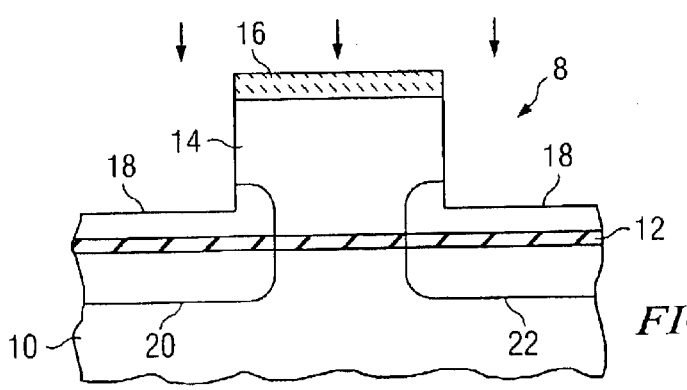

In FIG. 1D, source region 20 and drain region 22 are defined by implanting suitable dopants into semiconductor device 8 and then annealing semiconductor device 8, as illustrated in FIG. 1D. Etched hardmask 16 shown in FIG. 1D serves as a mask defining source region 20 and drain region 22 for a gate to be formed. Examples of dopants include boron and arsenic; however any other suitable dopant may be used. The dopant is driven into substrate layer 10 through portions 18 of polysilicon layer 14 to define source and drain regions 20 and 22. This may be accomplished using an annealing process. In one embodiment, the annealing process occurs between 1,000 to 1,100 degrees Celsius; however, higher or lower temperatures may be used. By forming source region 20 and drain region 22 through incompletely etched portions 18 of polysilicon layer 14, a higher temperature range may be used in the annealing process to reduce the series resistance associated with the formation of source and drain regions while realizing shallow junctions to meet any leakage current targets. Also, by forming source and drain regions prior to forming the source and drain extensions, a higher temperature range may be used in the anneal process without the concern of lateral over-expansion of the extensions. It should be noted that, contrary to conventional techniques, the source and drain extensions are not formed at this processing stage.

Figure 1E:
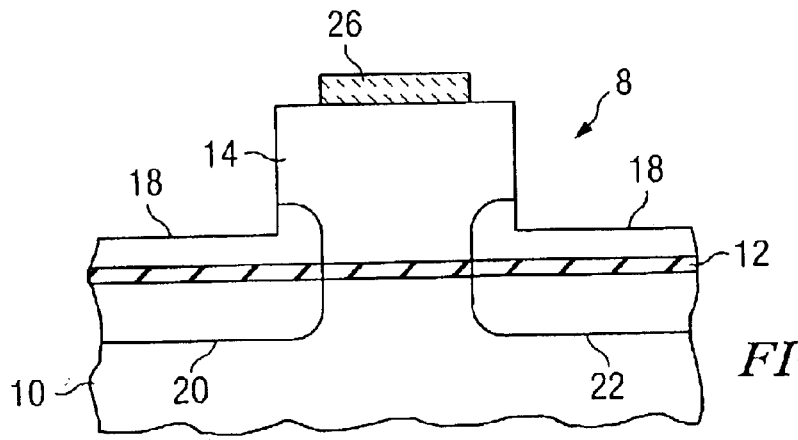
Figure 1F:
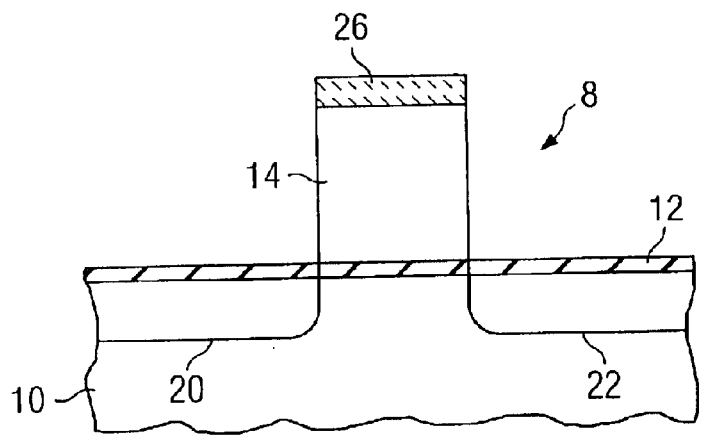

FIG. 1E shows the results of performing a hardmask trim etch to define a portion 26 of hardmask 16. This hard mask trim etch is performed to meet the critical dimension of the gate to be formed. After trimming hardmask 16, the incompletely etched polysilicon layer 14 is etched again utilizing the trimmed hardmask 16 as a mask to result in the structure of FIG. 1F. Any suitable etch process may be used to etch polysilicon layer 14, such as a dry etch according to conventional or yet to be realized techniques.

Figure 1G:
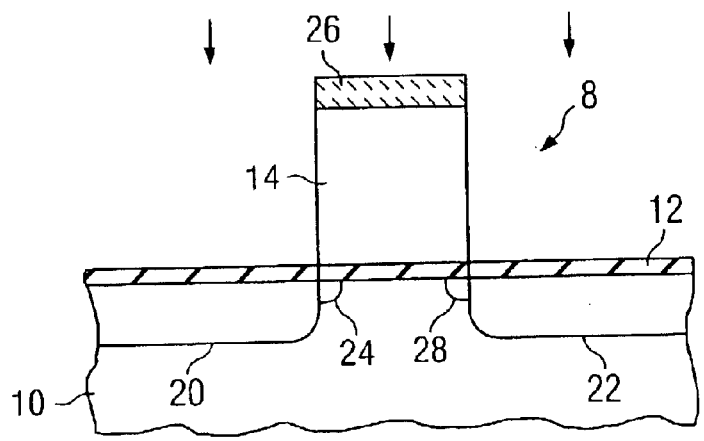

FIG. 1G shows one embodiment of a source extension 24 formation and a drain extension 28 formation. Source extension 24 and drain extension 28 are formed through a second implantation and anneal step. As described above, the implantation may be performed in any suitable manner utilizing any suitable dopant. In one embodiment, an annealing process using a temperature range that is lower than the one used for forming source region 20 and drain region 22 may be used to drive the implants laterally to define source and drain extensions 24 and 26; however, other temperature ranges, including temperature ranges that are higher than the one used for forming source region 20 and drain region 22, may also be used. In one embodiment, the temperature range for the annealing process associated with forming source extension 24 and drain extension 28 may be approximately 800 to 1,000 degrees Celsius. One embodiment of the process described using FIGS. 1A through 1F results in the shallow or ultra-shallow junction formation illustrated in FIG. 1G.

In contrast to conventional techniques in which the source and drain extensions are defined prior to the source and drain regions, the source and drain extensions here are formed subsequent to formation of the source and drain regions. Therefore, source and drain extensions undergo one anneal process. By being annealed only once, the source and drain extensions 24 and 26 may be more accurately defined, avoiding a second annealing process where the extensions 24 and 26 may be over-extended.

Figure 2A:
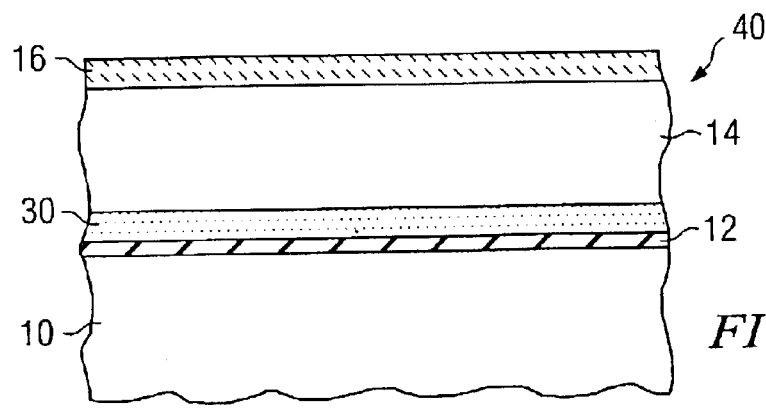
FIGS. 2A through 2C are cross-sectional diagrams showing an alternative embodiment of the method illustrated by the figures of FIG. 1A through FIG. 1G.
Figure 2B:
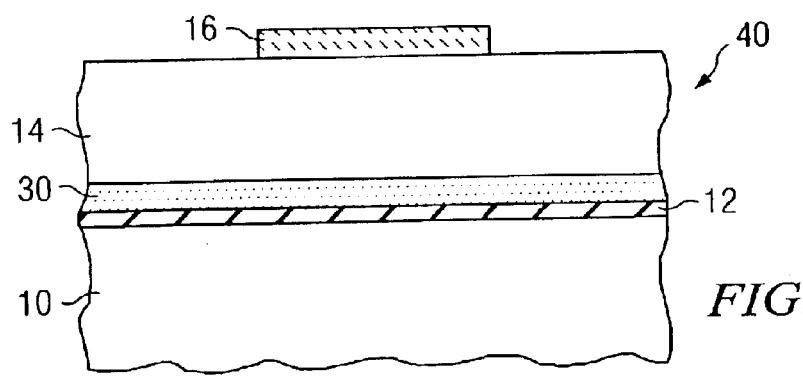
Figure 2C:
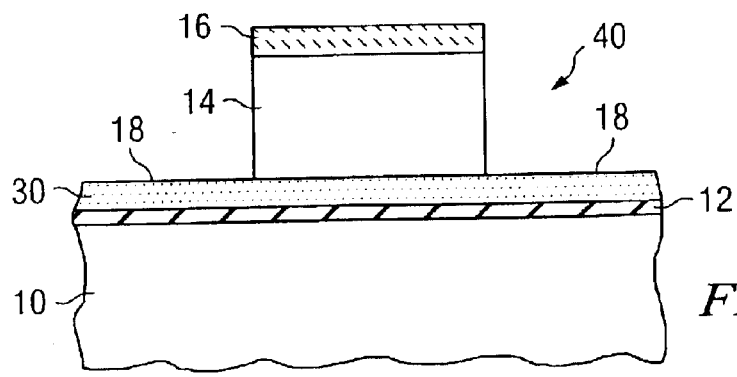

FIGS. 2A through 2C show cross-sectional diagrams of transistor formation using an etch rate monitoring etch process according to the teachings of the present invention. A semiconductor device 40 has an analogous structural layout as semiconductor device 8 shown in FIG. 1A, except that an additional polysilicon layer 30 overlying gate dielectric 12 and underlying polysilicon layer 16 is provided. In one embodiment, by providing polysilicon layer 30, semiconductor device 40 comprises a polysilicon region having dual zones or layers. According to an etch rate monitoring etch process, two different types of polysilicon layers are utilized such that a difference in etch rate will occur between the two. For example, different pressures of deposition may be utilized to define the different types of polysilicon layers, such as polysilicon layers 30 and 14. Polysilicon layer 30 halts or substantially halts the etching of polysilicon layer 14 to facilitate an incomplete etch of the polysilicon region formed by layers 14 and 30.

In FIG. 2B, portions of hardmask 16 have been removed as described above in conjunction with FIGS. 1A and 1B. In FIG. 2C an etch rate monitoring polysilicon etch is performed that etches polysilicon layer 14 until it reaches polysilicon layer 30. A change in rates associated with different types of polysilicon utilized for polysilicon regions 30 and 14 indicates that the desired stopping point has been reached. After determining that polysilicon layer 30 is reached, etching halts, leaving behind portions 18 of polysilicon layer 30 that may be used as a screen for the underlying layers.

Although some embodiments of the present invention have been described in detail, it should be understood that various changes, substitutions, and alterations can be made hereto without departing from the spirit and scope of the invention as defined by the appended claims.

What is claimed is:

1. A method for manufacturing a transistor, comprising:

providing a device including a hardmask, a polysilicon layer, and a substrate layer, the hardmask overlying the polysilicon layer, the polysilicon layer overlying the substrate layer;

etching the hardmask in a pattern that defines a feature, the feature having a dimension greater than a critical dimension of a gate to be formed;

reducing the thickness of a portion of the polysilicon layer that does not underlie the hardmask by incompletely etching the polysilicon layer according to the pattern of the hardmask;

after reducing the thickness, forming, in the substrate layer, a source region and a drain region for the gate by doping and annealing the device at a first temperature;

after forming the source region and the drain region, forming the gate by trimming the hardmask to meet the critical dimension and etching the polysilicon layer according to the trimmed hardmask; and after forming the source region, the drain region, and the gate, forming a source extension and a drain extension in the substrate layer by doping and annealing the device at a second temperature.

2. The method of claim 1, wherein the second temperature is lower than the first temperature.

3. The method of claim 1, wherein forming the source region and the drain region comprises doping the substrate layer by applying a level of implant energy that is sufficient to penetrate through the portion of the polysilicon layer having reduced thickness.

4. The method of claim 1, wherein the second temperature is less than 1000 degrees Celsius.

5. A method for manufacturing a transistor, comprising:

masking a polysilicon layer of a semiconductor device to have a dimension greater than a critical dimension of a gate to be formed, the polysilicon layer overlying a substrate layer;

incompletely etching the polysilicon layer;

forming a source region and a drain region in the substrate layer through the incompletely etched polysilicon layer by doping the substrate layer and applying heat at a first temperature; and after forming the source region and the drain region, forming a source extension and a drain extension in the substrate layer by doping the substrate layer and applying heat at a second temperature.

6. The method of claim 5, wherein the second temperature is lower than the first temperature.

7. The method of claim 5, wherein forming the source region and the drain region comprises doping the substrate layer by applying a level of implant energy that is sufficient to penetrate through the incompletely etched polysilicon layer.

8. The method of claim 5, wherein the second temperature is less than 1000 degrees Celsius.

9. The method of claim 5, and further comprising:

after forming the source region and the drain region, trimming the dimension defined by the masking of the polysilicon layer to meet the critical dimension; and forming the gate before forming the source extension and the drain extension by etching the polysilicon layer.

10. The method of claim 5, wherein the incompletely etched portions of the ploysilicon layer has thickness of approximately 100 angstroms.

11. The method of claim 5, wherein the polysilicon layer comprises a first polysilicon layer and a second polysilicon layer underlying the first silicon layer, and wherein incompletely etching the polysilicon layer comprises etching the first polysilicon layer until the second polysilicon layer is reached.

12. The method of claim 5, wherein the first temperature is equal to or greater than approximately 1,000 degrees Celsius.

13. The method of claim 4, wherein the first temperature is equal to or greater than approximately 1,000 degrees Celsius, the second temperature is less than or equal to approximately 1,000 degrees Celsius, and the incompletely etched portion of the polysilicon layer is approximately 50 to 500 angstroms.

14. A method for manufacturing a transistor, comprising:

masking a polysilicon layer of a semiconductor device to have a dimension greater than a critical dimension of a gate to be formed, the polysilicon layer overlying a substrate layer;

incompletely etching the polysilicon layer;

forming a source region and a drain region in the substrate layer by doping the substrate layer through the incompletely etched polysilicon layer and applying heat at a first temperature;

after forming the source region and the drain region, forming the gate by reducing the dimension defined by the masking of the polysilicon layer to meet the critical dimension and etching the polysilicon layer; and after forming the gate, forming a source extension and a drain extension in the substrate layer by doping the substrate layer and applying heat at a second temperature, wherein the source extension and the drain extension substantially underlie the gate and the second temperature is lower than the first temperature.

15. The method of claim 12, wherein the first temperature is between 1,000 and 1,100 degrees Celsius.

16. The method of claim 14, wherein forming the source region and the drain region comprises doping the substrate layer by applying a level of implant energy that is sufficient to penetrate through the incompletely etched polysilicon layer.

17. The method of claim 14, wherein the second temperature is less than 1000 degrees Celsius.

18. The method of claim 14, and further comprising forming the gate by etching the polysilicon layer after reducing the dimension but before forming the source extension and the drain extension.

19. The method of claim 14, wherein the incompletely etched portions of the polysilicon layer has a thickness of approximately 100 angstroms.

20. The method of claim 14, wherein the polysilicon layer comprises a first polysilicon layer and a second polysilicon layer underlying the first silicon layer, and wherein incompletely etching the polysilicon layer comprises etching the first polysilicon layer until the second polysilicon layer is reached.

21. A method for manufacturing a transistor, comprising:

providing a device including a hardmask, a polysilicon layer, and a substrate layer, the hardmask overlying the polysilicon layer, the polysilicon layer overlying the substrate layer;

etching the hardmask in a pattern that defines a feature, the feature having a dimension greater than a critical dimension of a gate to be formed;

reducing the thickness of a portion of the polysilicon layer that is uncovered by the hardmask;

after reducing the thickness, forming, in the substrate layer, a source region and a drain region for the gate by doping and annealing the device at a first temperature;

after forming the source region and the drain region, forming the gate by trimming the hardmask to meet the critical dimension and etching the polysilicon layer according to the trimmed hardmask; and after forming the source region, the drain region, and the gate, forming a source extension and a drain extension in the substrate layer by doping and annealing the device at a second temperature lower than the first temperature.

* * * * *